United States Patent
Chang et al.

(10) Patent No.: US 7,755,378 B2
(45) Date of Patent: *Jul. 13, 2010

(54) CLAMPING TOP PLATE USING MAGNETIC FORCE

(75) Inventors: Kyun-Jung Chang, Waterloo (CA); Arkady Ivannikov, Mississauga (CA); Marek Reksnis, Waterloo (CA)

(73) Assignee: Research in Motion Limited, Waterloo, Ontario (CA)

( * ) Notice: Subject to any disclaimer, the term of this patent is extended or adjusted under 35 U.S.C. 154(b) by 51 days.

This patent is subject to a terminal disclaimer.

(21) Appl. No.: 12/030,475

(22) Filed: Feb. 13, 2008

(65) Prior Publication Data

US 2008/0136435 A1  Jun. 12, 2008

Related U.S. Application Data

(63) Continuation of application No. 11/206,198, filed on Aug. 18, 2005, now Pat. No. 7,355,427.

(51) Int. Cl.
*G01R 31/26* (2006.01)
(52) U.S. Cl. .................................. 324/765; 324/158.1
(58) Field of Classification Search ................ 439/331; 324/755, 758, 765
See application file for complete search history.

(56) References Cited

U.S. PATENT DOCUMENTS

| | | | |
|---|---|---|---|
| 3,280,715 A | 10/1966 | Corl et al. | |
| 4,975,637 A | 12/1990 | Frankeny et al. | |
| 5,135,012 A | 8/1992 | Kamen et al. | |
| 5,436,567 A | 7/1995 | Wexler et al. | |
| 5,468,158 A * | 11/1995 | Roebuck et al. | 439/264 |
| 5,572,144 A | 11/1996 | Davidson et al. | |
| 5,766,022 A * | 6/1998 | Chapin et al. | 439/73 |
| 5,831,160 A * | 11/1998 | Steketee | 73/431 |
| 5,919,050 A * | 7/1999 | Kehley et al. | 439/71 |
| 5,997,316 A * | 12/1999 | Kunzel | 439/73 |
| 6,354,859 B1 * | 3/2002 | Barabi et al. | 439/331 |
| 6,509,754 B2 | 1/2003 | Lin et al. | |
| 6,607,396 B1 * | 8/2003 | Ito | 439/331 |
| 6,737,882 B2 * | 5/2004 | Wood et al. | 324/765 |
| 6,746,261 B2 * | 6/2004 | Petit et al. | 439/331 |

(Continued)

OTHER PUBLICATIONS

"Agilent Technologies' TS-50 RF Shielded Test Fixtures", pp. 1-8, Retrieved from the Internet: URL:http://cp.literature.agilent.com/litwe b/pdf/5968-6858E.pdf.

*Primary Examiner*—Ha Tran T Nguyen
*Assistant Examiner*—Richard Isla Rodas
(74) *Attorney, Agent, or Firm*—Ogilvy Renault LLP

(57) ABSTRACT

A test fixture, for testing an electronic device, includes: a test platform including electrically conductive contacts protruding from a device receiving surface in the test platform; a positioning guide disposed on the device receiving surface; a device retention cover; where the test platform includes a platform magnetic member and the retention cover includes a cover magnetic member, the platform magnetic member and the cover magnetic member being mutually magnetically attractive. A method of producing an electronic device including: preparing the test fixture, for testing the electronic device; placing the electronic device using the at least one device positioning guide disposed on the device receiving surface; and placing the device retention cover upon the electronic device to apply a force to the electronic device.

20 Claims, 7 Drawing Sheets

U.S. PATENT DOCUMENTS

2002/0074993 A1 6/2002 Boswell et al.
2004/0226167 A1 11/2004 Tseng et al.
2004/0257097 A1* 12/2004 Beaucag et al. ............. 324/754

* cited by examiner

CLAMPING TOP PLATE USING MAGNETIC FORCE

CROSS REFERENCE TO RELATED APPLICATIONS

This application is a continuation of U.S. patent application Ser. No. 11/206,198 filed Aug. 18, 2005.

TECHNICAL FIELD

An electronic component testing fixture positions and then clamps a component between a test bed platform and a manually removable clamping plate using magnetic attractive force.

BACKGROUND OF THE ART

The testing of electronic components or devices during manufacturing involves use of a test fixture to accurately position the device under test so that electrical contacts are properly engaged to perform the test. Inaccurate placement or lack of appropriate electrical contact could result in a false rejection of the device under test and significant waste.

For example, power contacts and control system contacts on circuit board devices are engaged with matching contacts on a test fixture by manually or mechanically placing the circuit board device on the test fixture. Guide pins or other physical barriers are located on the test bed to accurately guide and locate the device to be tested into the correct testing position.

In the in use application of a circuit board device, the electrical contacts may be soldered, or engaged with tight fitting connectors, and the circuit boards are usually snap-locked, fastened or clamped securely in a housing to avoid malfunctions or short circuits in use.

However, in a test fixture, such secure means of making electrical contacts are inefficient and would interfere with the speed of testing required during manufacture. Test fixtures therefore include temporary means of making electrical contact which minimize the risk damage to the device under test and which aim to involve minimal time in positioning and withdrawing the devices under test to increase the speed of testing.

Since many electronic devices are very light weight and flexible, merely placing the devices in a test fixture is insufficient to ensure that proper electrical contact is made. Commonly the device is physically clamped to exert pressure on the matching electric contacts and ensure that a reliable connection is made for conducting the testing procedure.

Pneumatic, hydraulic or mechanical clamping systems, including robotic systems are commonly used for this clamping function. However, all such systems require physical space in the manufacturing facility, require maintenance due to inevitable wear and tear of moving parts, and require periodic adjustments to maintain accuracy, consume power, impose operating and capital costs, and often create significant noise or safety hazards. In many cases, the test fixture and associated clamping system must be housed within a protective housing such as a radio frequency housing, a noise suppression housing, a dust proof housing, a temperature controlled housing or other protected environments. The use of mechanical, pneumatic or hydraulic clamping systems significantly increases the necessary space volume of any protective enclosure consuming manufacturing space and imposing various costs on the manufacturing process.

DESCRIPTION OF THE DRAWINGS

In order that the subject matter may be readily understood, one embodiment of the subject matter is illustrated by way of example in the accompanying drawings.

Further details of the test fixture and its advantages will be apparent from the detailed description included below.

DETAILED DESCRIPTION OF PREFERRED EMBODIMENTS

There is provided a test fixture, for testing an electronic device, including: a test platform including electrically conductive contacts protruding from a device receiving surface in the test platform; a positioning guide disposed on the device receiving surface; a device retention cover; where the test platform includes a platform magnetic member and the retention cover includes a cover magnetic member, the platform magnetic member and the cover magnetic member being mutually magnetically attractive.

Further, there is provided a method of producing an electronic device including: preparing the test fixture, for testing the electronic device; placing the electronic device using the at least one device positioning guide disposed on the device receiving surface; and placing the device retention cover upon the electronic device to apply a force to the electronic device.

Figure 1:
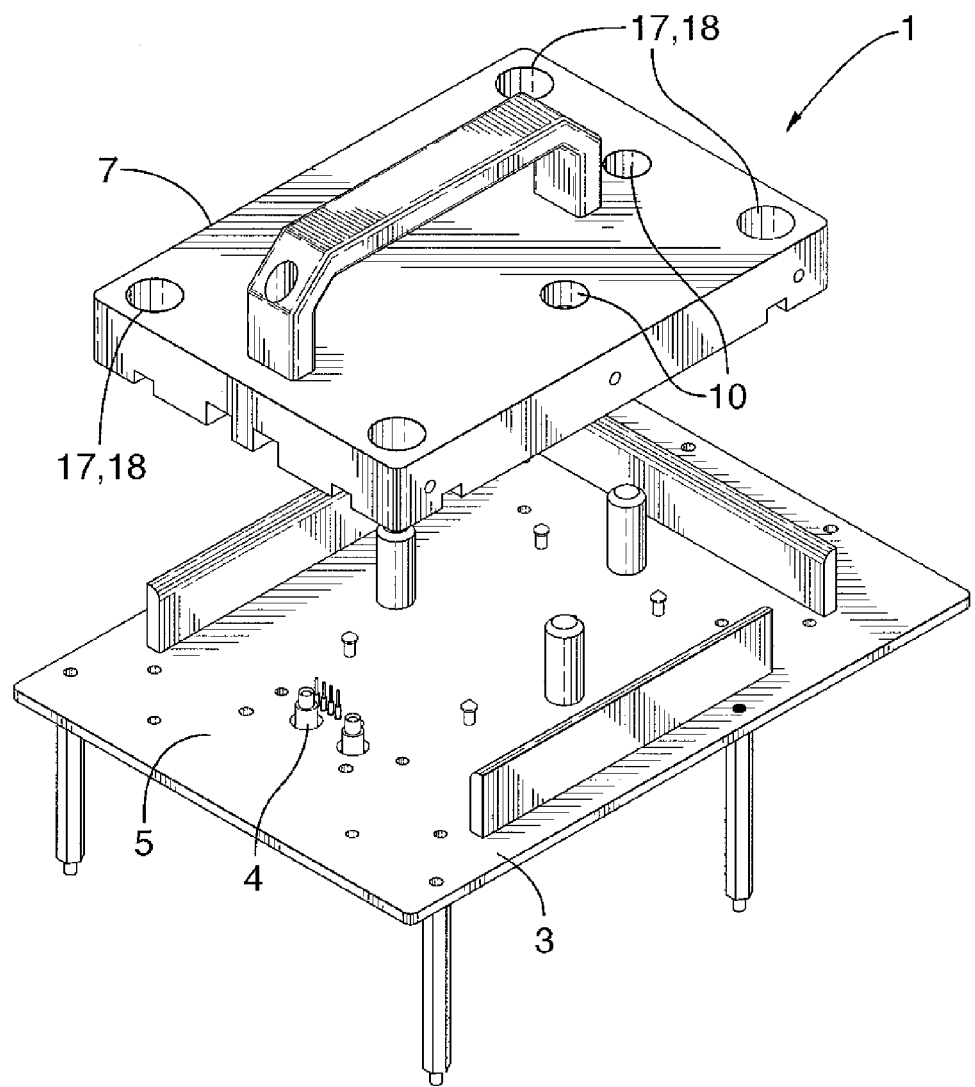
FIG. 1 is a top isometric view of one embodiment showing a test fixture with test platform with cylindrical pins as device positioning guides and at an elevated position a retention cover with manual grip handle having matching cylindrical recesses and having a cylindrical recess socket in each corner to house permanent corner.
Figure 2:
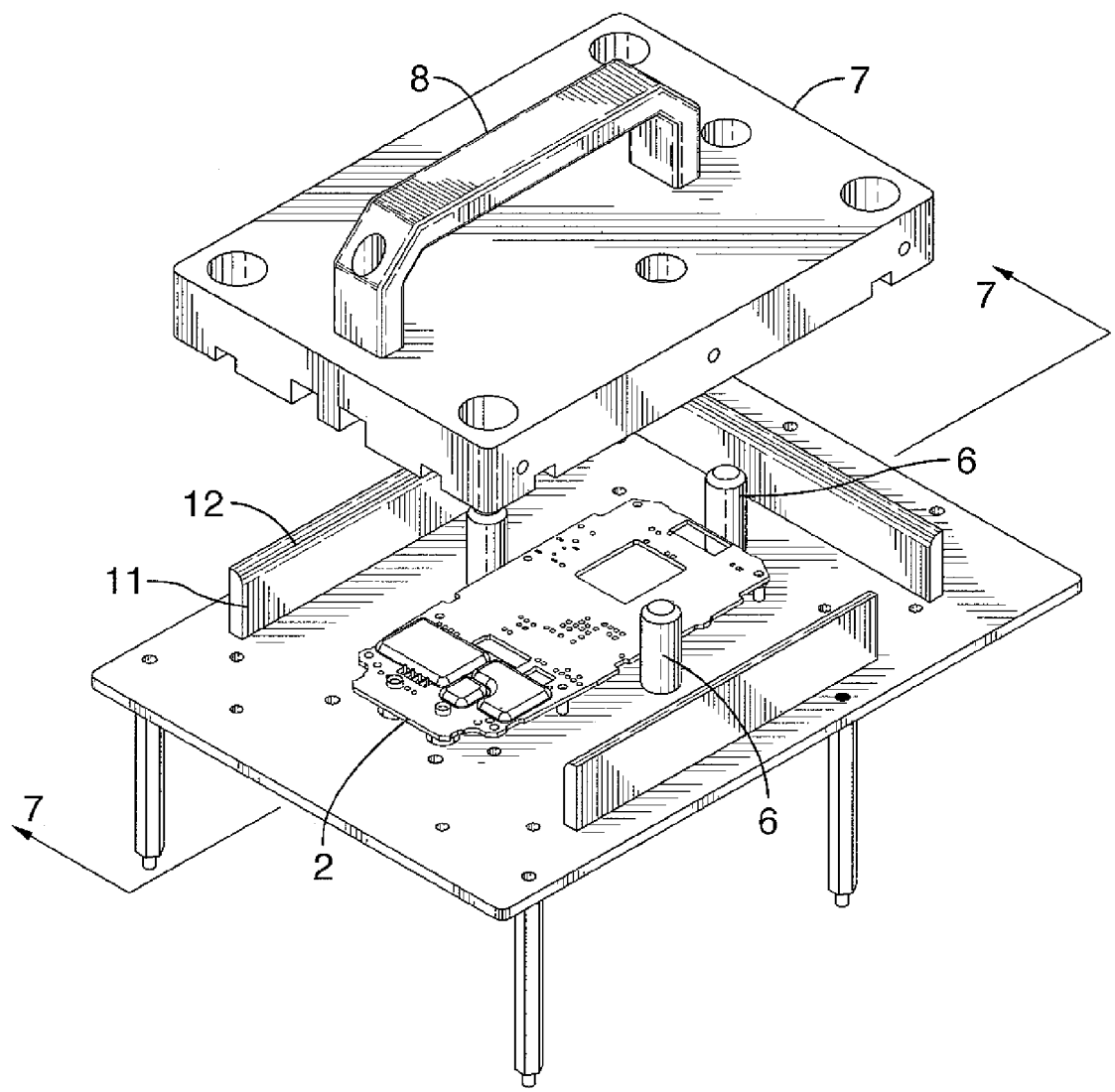
FIG. 2 is a like top isometric view showing an electronic device positioned on the electrically conductive contacts protruding from the test platform and aligned by the cylindrical pins serving as device positioning guides.

With reference to FIGS. 1 and 2, the test fixture 1 is provided for testing an electronic device 2 such as the illustrated circuit board for a wireless communication device.

The test fixture 1 includes a test platform 3 including electrically conducting contacts 4 (best seen in FIG. 1) which protrude from a device receiving surface 5 of the test platform 3.

Figure 3:
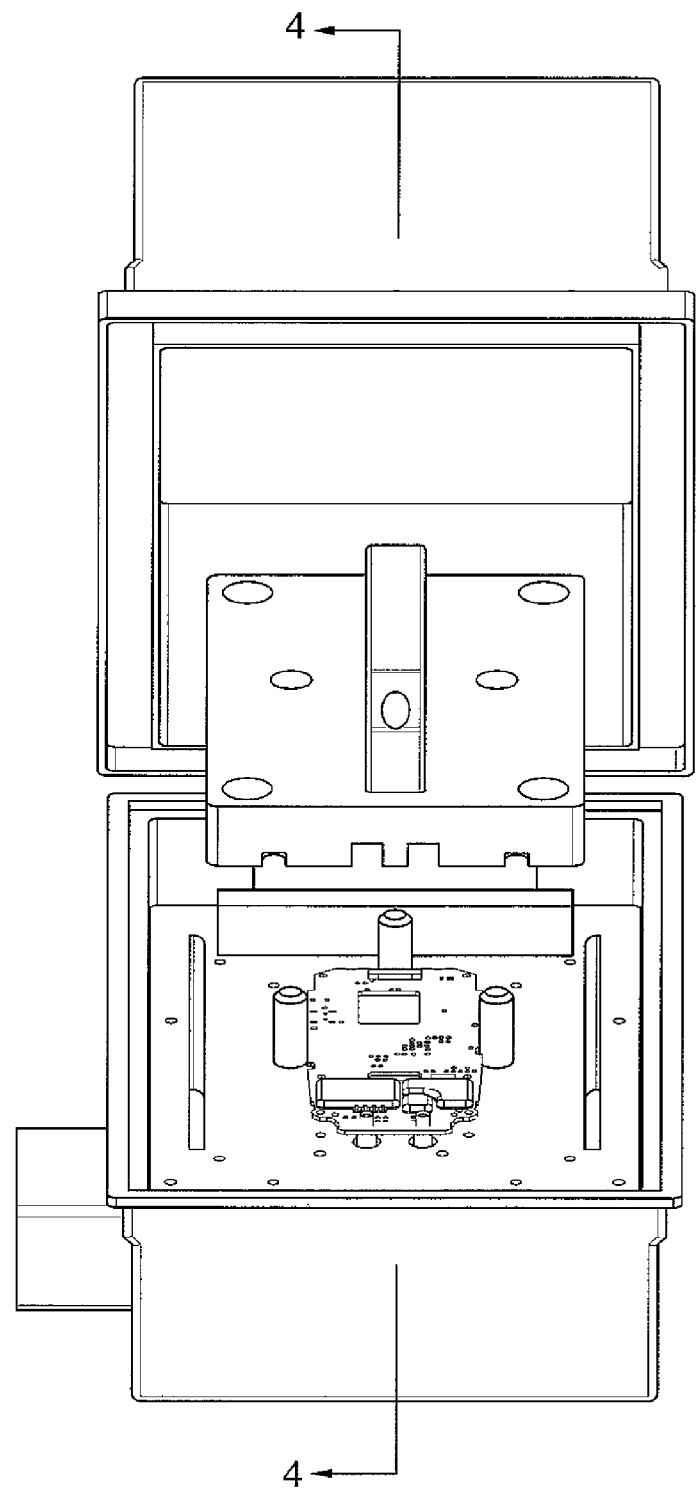
FIG. 3 is a front isometric view showing the electronic device for testing position within the test platform and showing containment housing with hinged lid surrounding the entire test platform.

As best seen in FIGS. 2 and 3, the test platform 3 includes device positioning guides 6 disposed on the device receiving surface 5. In the embodiment illustrated, the device positioning guides 6 comprise cylindrical pins. However, it will understood that depending on the configuration of the electronic device 2, various other device positioning guides 6 can be provided such as planar members, shape conforming surfaces or rectangular protrusions for example.

It will also be understood that the test platform 3 can be easily reconfigured for various types of electronic devices 2 by removing the cylindrical pins 6 and relocating guides to different positions to accommodate different electronic devices 2.

Figure 6:
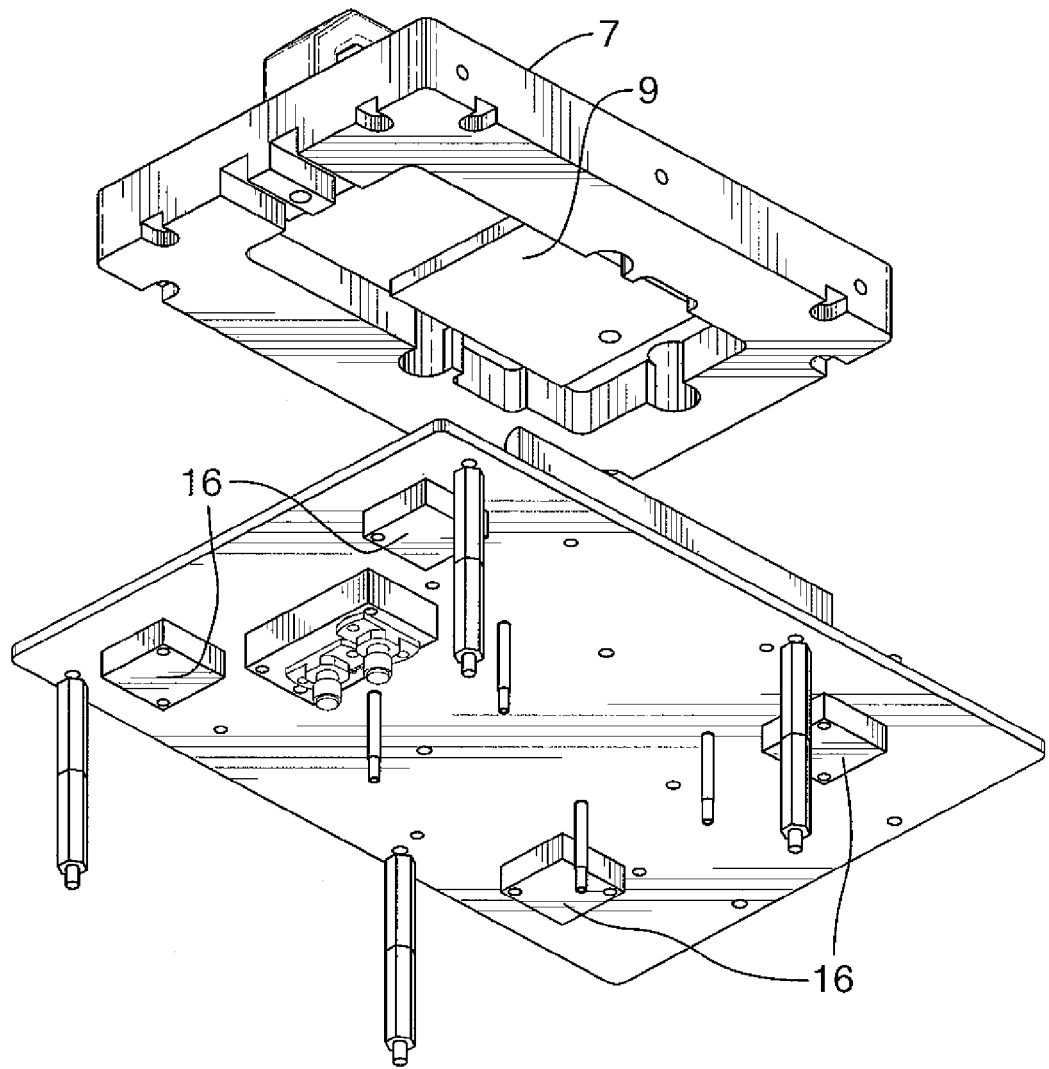
FIG. 6 is a bottom isometric view of the test fixture showing the bottom of the test platform with electrical contacts and platform magnetic members housed beneath the platform and showing the device retention cover with a receiving socket for receiving the electronic device therein.
Figure 7:
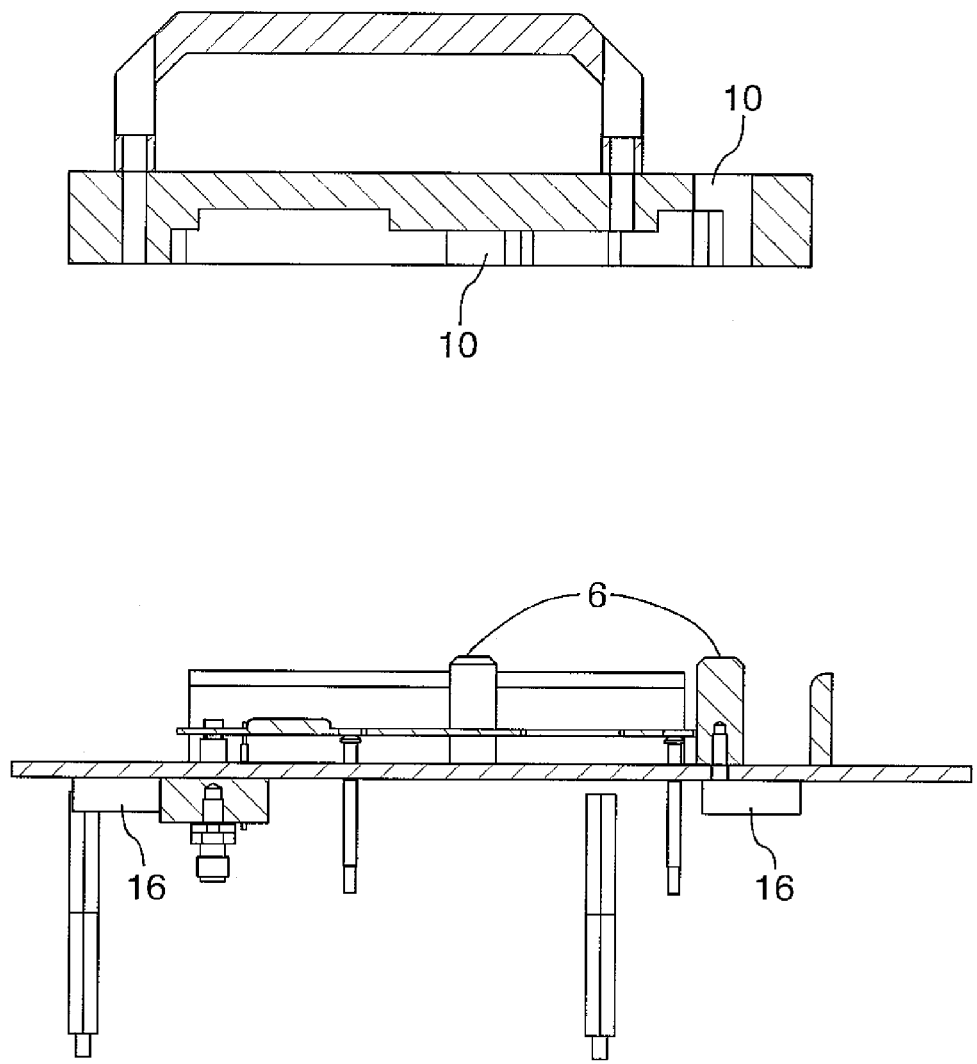
FIG. 7 is a detailed sectional view along lines 7-7 of FIG. 2.

The device retention cover 7 in the embodiment shown is a simple rectangular machined plate having a manual grip 8. As best seen in FIG. 6, the device retention cover 7 preferably includes a device receiving socket 9 that engages the device 2 and exerts a downward pressure to maintain adequate contact with the electrically conducting contacts 4.

The device retention cover 7 is manually positioned using cylindrical recesses 10 positioned to match the cylindrical pins 6. Further, to guide the cover 7, the test platform 3 includes three peripheral walls 11 disposed on the device receiving surface 5 each aligned with an outside edge of the retention cover 7 when the retention cover 7 is a covered position over the electronic device 2. To improve manual guiding of the cover 7, the peripheral wall 11 includes an inwardly chamfered cover guiding edge 12.

Figure 4:
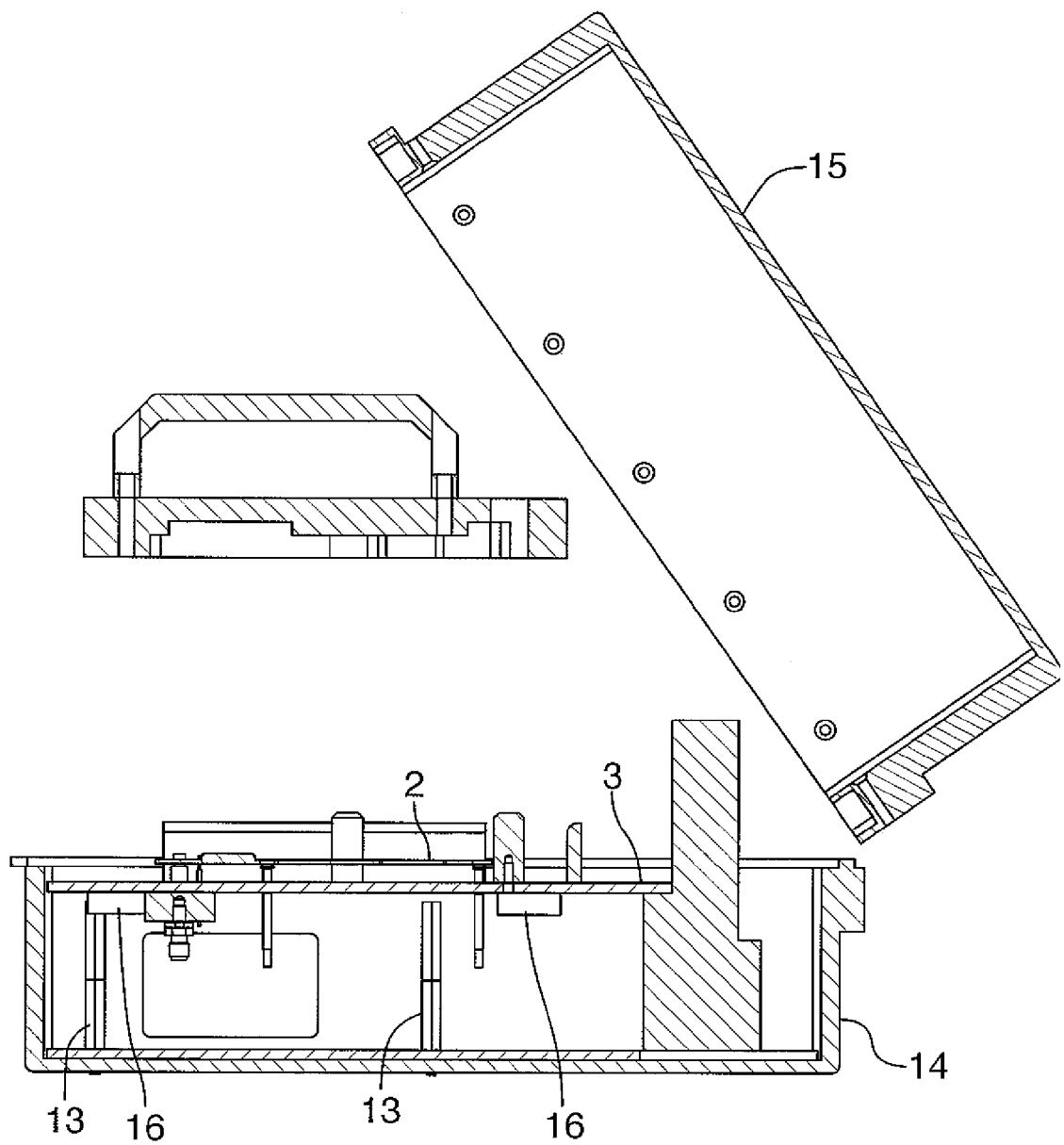
FIG. 4 is a vertical sectional view through the housing and test platform as indicated with lines 4-4 in FIG. 3.
Figure 5:
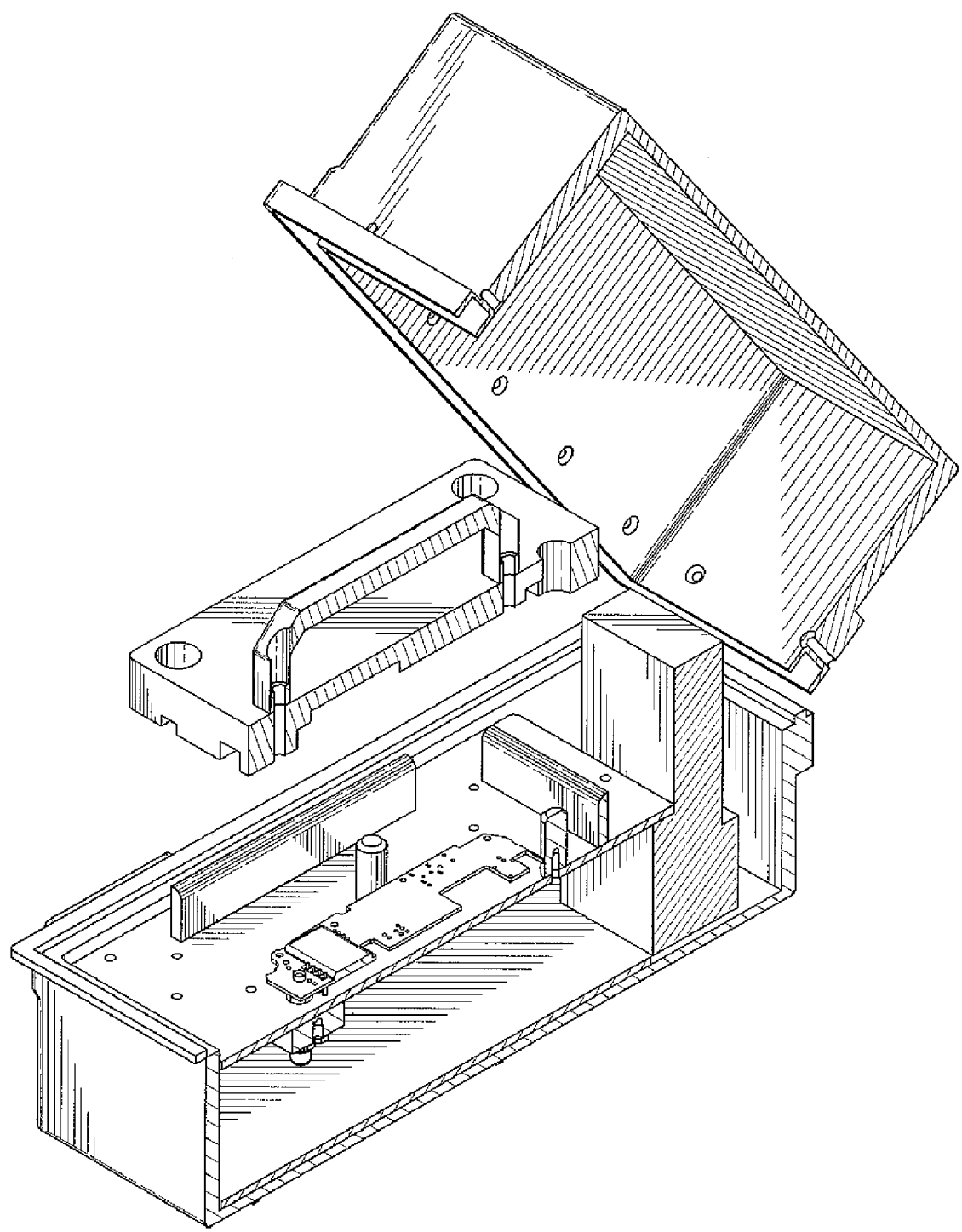
FIG. 5 is an isometric view along the same section shown in FIG. 4.

As shown in FIGS. 4 and 6, preferably the text platform 3 includes adjustable height removable support legs 13 and is housed within a container housing 14 with a hinged lid 15 for access. As illustrated, the support leg 13 provides adaptability to change the test fixture 1 for varying sizes of electronic devices 2 and the containment housing 14 being a simple rectangular housing with hinged lid 15 can be adapted for various sizes and shapes of electronic devices 2 for testing. In one embodiment for example, the containment housing 14 comprises a radio frequency blocking enclosure. However, other protective environments can be provided in a like manner such as noise suppression housing, a dust proof housing or a temperature control housing.

Turning to FIGS. 1, 4 and 6, it can be seen that the test platform 3 includes a platform magnetic member 16 as illustrated in each of the four corners. The retention cover 7 likewise includes four cover magnetic members 17 are removably housed within a recess socket 18. It will be understood that in order to exert a clamping pressure on the electronic device 2, that the platform magnetic members 16 and the cover magnetic members 17 are mutually magnetically attractive. The degree of compressive force applied by the retention cover 7 can be easily modified by selecting appropriate permanent magnets for the platform magnetic member 16 and retention cover member 17.

The platform magnetic members 16 and retention cover magnetic members 17 are preferably mutually aligned on an axis normal to the test platform 3 as illustrated in the accompanying drawings. Alignment avoids any twisting of the cover 7 relative to the test platform 3 during installation and withdrawal.

As illustrated, the components of the test fixture 1 are preferably modular in design, easily removed and replaced in various positions. The modular design results in easy modification, flexibility and relative low cost. Compared to mechanical clamping systems, pneumatic or hydraulically actuated clamping devices, the test fixture 1 is low cost and small size having only one moving part, the cover 7, that is manually positioned. Wear and tear of the fixture 1, maintenance and calibration are substantially reduced if not completely eliminated. The manual operation will alert the person performing the test to any misalignment or malfunction. As a result, safe operation is ensured, the device requires less space than mechanically operating clamping devices, and will be longer lasting requiring little maintenance while remaining simple to modify for various manufacturing applications.

We claim:

1. A test fixture for testing an electronic device, the test fixture comprising:

a test platform including electrically conductive contacts on a device-receiving surface of the test platform;

a plurality of device-positioning guides disposed on the device-receiving surface for positioning the electronic device on the test platform; and a fully removable cover having a plurality of recesses for mechanically engaging respective device-positioning guides for retaining the electronic device on the test platform;

wherein the removable cover engages the test platform and maintains a clamping pressure through a magnetic attraction between the cover and the test platform for maintaining electrical contact between the electrically conductive contacts and the electronic device, in absence of any mechanical, pneumatic or hydraulic clamping.

2. The test fixture as claimed in claim 1 wherein the fully removable cover comprises a plurality of sockets for receiving cylindrical magnetic inserts that are magnetically attracted to the test platform.

3. The test fixture as claimed in claim 1 wherein the device-positioning guides are cylindrical pins for engaging cylindrical recesses formed in the fully removable cover.

4. The test fixture as claimed in claim 1 wherein the test platform comprises a plurality of cover alignment guides disposed on the device-receiving surface that align with an outside edge of the fully removable cover when disposed in a covered position.

5. The test fixture as claimed in claim 1 wherein the fully removable cover has a test-platform-facing surface with a device-receiving socket.

6. The test fixture as claimed in claim 1 wherein the test platform comprises height-adjustable support legs for supporting differently sized electronic devices.

7. The test fixture as claimed in claim 1 wherein the test platform comprises a containment housing.

8. The test fixture as claimed in claim 7 wherein the containment housing comprises a radio frequency blocking enclosure.

9. The test fixture as claimed in claim 7 wherein the containment housing has a hinged lid.

10. The test fixture as claimed in claim 1 wherein there is a magnetic field between the removable cover and the test platform for maintaining the clamping pressure.

11. A method of testing an electronic device, the method comprising:

preparing a test fixture for testing the electronic device, the test fixture having a test platform including electrically conductive contacts on a device-receiving surface of the test platform;

positioning the electronic device on the test platform using a plurality of device-positioning guides disposed on the device-receiving surface;

placing a fully removable cover upon the electronic device by aligning recesses in the fully removable cover with respective device-positioning guides to apply a clamping force to the electronic device through a magnetic attraction between the cover and the test platform electronic device in the test fixture and maintain electrical contact between the electrically conductive contacts and the electronic device, in absence of any mechanical, pneumatic or hydraulic clamping means.

12. The method as claimed in claim 11 further comprising closing a lid of a containment housing over the test platform after placing the fully removable cover upon the electronic device.

13. The method as claimed in claim 11 further comprising a step of reconfiguring the test platform by relocating guides to different positions to accommodate different electronic devices.

14. The method as claimed in claim 11 wherein there is a magnetic field between the fully removable cover and the test platform for applying the clamping force.

15. A test fixture for testing an electronic device, the test fixture comprising:
- a test platform including electrically conductive contacts on a device-receiving surface of the test platform;
- a plurality of device-positioning guides disposed on the device-receiving surface for positioning the electronic device on the test platform; and
- a fully removable cover having a plurality of recesses for mechanically engaging respective device-positioning guides for retaining the electronic device on the test platform;
- wherein the removable cover is brought into engagement with the test platform by a magnetic field, and maintains a clamping force on the electronic device via the magnetic field between the cover and the test platform, in absence of any mechanical, pneumatic or hydraulic means.

16. The test fixture as claimed in claim 15 wherein a clamping pressure is maintained between the removable cover and the test platform when the removable cover is brought into engagement with the test platform.

17. The test fixture as claimed in claim 15 wherein the fully removable cover comprises a plurality of sockets for receiving cylindrical magnetic inserts that are magnetically attracted to the test platform.

18. The test fixture as claimed in claim 15 wherein the test platform comprises a containment housing.

19. The test fixture as claimed in claim 18 wherein the containment housing comprises a radio frequency blocking enclosure.

20. The test fixture as claimed in claim 15 wherein the test platform comprises height-adjustable support legs for supporting differently sized electronic devices.

* * * * *